（12） United States Patent
Fornage et al.

(10) Patent No.: US 9,130,570 B2
(45) Date of Patent: Sep. 8, 2015

(54) FOUR QUADRANT BIDIRECTIONAL SWITCH

(75) Inventors: Martin Fornage, Petaluma, CA (US); Donald Richard Zimmanck, Petaluma, CA (US); Jeffrey Bernard Fedison, Petaluma, CA (US)

(73) Assignee: Enphase Energy, Inc., Petaluma, CA (US)

( * ) Notice: Subject to any disclaimer, the term of this patent is extended or adjusted under 35 U.S.C. 154(b) by 545 days.

(21) Appl. No.: 13/468,815

(22) Filed: May 10, 2012

(65) Prior Publication Data

US 2012/0287688 A1  Nov. 15, 2012

Related U.S. Application Data

(60) Provisional application No. 61/484,582, filed on May 10, 2011.

(51) Int. Cl.
*H02M 7/00* (2006.01)
*H03K 17/693* (2006.01)
*H02M 1/00* (2007.01)
*H03K 17/687* (2006.01)

(52) U.S. Cl.
CPC ..... *H03K 17/693* (2013.01); *H02M 2001/0048* (2013.01); *H03K 2017/6878* (2013.01); *Y02B 70/1491* (2013.01)

(58) Field of Classification Search
CPC ............................... H03K 17/693; H02M 1/10
USPC ........... 363/123, 140; 327/376, 377, 429, 436
See application file for complete search history.

(56) References Cited

U.S. PATENT DOCUMENTS

| | | | |
|---|---|---|---|
| 5,003,246 A | | 3/1991 | Nadd |
| 7,397,280 B2 * | | 7/2008 | Ker et al. ......................... 326/80 |
| 2007/0235293 A1 * | | 10/2007 | Steimer et al. .................... 200/2 |
| 2009/0065810 A1 | | 3/2009 | Honea et al. |
| 2009/0167411 A1 | | 7/2009 | Machida et al. |
| 2013/0270917 A1 * | | 10/2013 | Yatsu ............................. 307/77 |

FOREIGN PATENT DOCUMENTS

| | | |
|---|---|---|
| JP | 2010166793 A | 7/2010 |
| RU | 2230425 C1 | 6/2004 |
| WO | WO-2009153965 A1 | 12/2005 |

OTHER PUBLICATIONS

T. Morita, et.al "650V 3.1mΩcm$^2$ GaN-based Monolithic Bidirectional Switch using Normally-off Gate Injection Transistor," IEEE International Electron Devices Meeting, 2007, pp. 865-868.

N. Ikeda, et.al. "High power AlGaN/GaN HFET with a high breakdown voltage of over 1.8 kV on 4 inch Si substrates and the suppression of current collapse," 20th International Symposium on Power Semiconductor Devices and IC's, 2008, pp. 287-290.

(Continued)

*Primary Examiner* — Matthew Nguyen
(74) *Attorney, Agent, or Firm* — Moser Taboada

(57) ABSTRACT

A four quadrant bidirectional switch. In one embodiment, the four quadrant bidirectional switch comprises a first switch, a second switch, and a third switch, wherein (i) the first and second switches are normally-off switches, (ii) the third switch is a dual-gate, bidirectional, normally-on switch, and (iii) the first, the second, and the third switches are coupled to one another in a bi-cascode configuration.

20 Claims, 7 Drawing Sheets

(56) References Cited

OTHER PUBLICATIONS

International Search Report and Written Opinion dated Aug. 16, 2012 for PCT Application No. PCT/US2012/037350, 6 pages.

Supplementary European Search Report, Application No. EP 12 78 1652, Dated Sep. 19, 2014.

* cited by examiner

US 9,130,570 B2

FOUR QUADRANT BIDIRECTIONAL SWITCH

CROSS-REFERENCE TO RELATED APPLICATIONS

This application claims benefit of U.S. provisional patent application Ser. No. 61/484,582, filed May 10, 2011, which is herein incorporated in its entirety by reference.

BACKGROUND OF THE INVENTION

1. Field of the Invention

Embodiments of the invention relate to a bidirectional switch, in particular to a fully controlled, four quadrant, bidirectional switch.

2. Description of the Related Art

Fully controlled bidirectional power switches may be utilized in devices such as AC-AC matrix converters to provide the converters with higher operating efficiencies as compared to conventional DC-linked AC-AC converters.

A fully controlled four quadrant bidirectional switch can be implemented, for example, using two insulated gate bipolar transistors (IGBTs) in antiparallel along with two diodes in series, or utilizing two source-connected high-voltage metal-oxide-semiconductor field-effect transistors (MOSFETS). However, such solutions suffer from drawbacks such as high conduction loss and may be limited to relatively low frequencies (e.g., less than 50 kHz).

Therefore, there is a need in the art for an efficient fully controlled, four quadrant bidirectional switch.

SUMMARY OF THE INVENTION

Embodiments of the present invention generally relate to a four quadrant bidirectional switch. In one embodiment, the four quadrant bidirectional switch comprises a first switch, a second switch, and a third switch, wherein (i) the first and second switches are normally-off switches, (ii) the third switch is a dual-gate, bidirectional, normally-on switch, and (iii) the first, the second, and the third switches are coupled to one another in a bi-cascode configuration.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1:
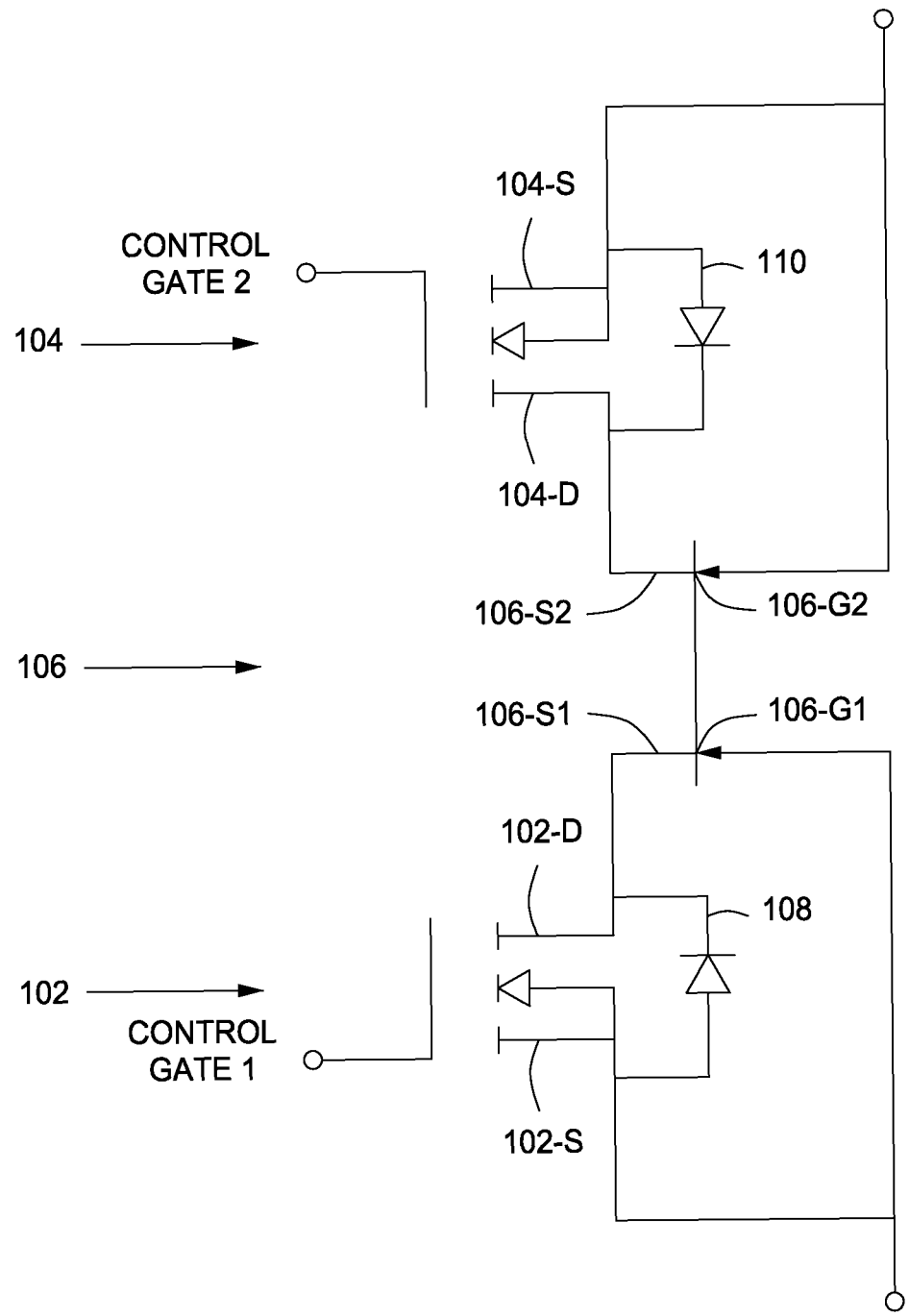
FIG. 1 is a schematic diagram of a bidirectional power switch in accordance with one or more embodiments of the present invention.

FIG. 1 is a schematic diagram of a bidirectional power switch 100 in accordance with one or more embodiments of the present invention. The bidirectional power switch 100, also referred to as "switch 100", is a fully controlled, four quadrant bidirectional power switch. The switch 100 comprises switches 102, 104, and 106. The switches 102 and 104 are each normally-off field effect transistors (FETs), such as low-voltage (generally less than or equal to 30 volts) silicon metal-oxide-semiconductor field-effect transistors (MOSFETS), and the switch 106 is a single normally-on dual gate bidirectional switch. The switches 102, 106, and 104 are coupled in a bi-directional cascade, or bi-cascode, configuration, where a drain terminal 102-D of the switch 102 is coupled to a first source terminal 106-S1 of the switch 106, and a second source terminal 106-S2 of the switch 106 is coupled to a drain terminal 104-D of the switch 104. A source terminal 102-S of the switch 102 is coupled to a first gate terminal 106-G1 of the switch 106, and a second gate terminal 106-G2 of the switch 106 is coupled to a source terminal 104-S of the switch 104.

The switch 102 has a body diode 108 coupled across its source terminal 102-S and drain terminal 102-D, where an anode terminal of the body diode 108 is coupled to the source terminal 102-S and a cathode terminal of the body diode 108 is coupled to the drain terminal 102-D. The switch 104 has a body diode 110 coupled across its source terminal 104-S and drain terminal 104-D, where an anode terminal of the body diode 110 is coupled to the source terminal 104-S and a cathode terminal of the body diode 110 is coupled to the drain terminal 104-D.

The switches 102 and 104 may be commercially-available low-voltage MOSFETs having very low on-resistance. In one embodiment, the switches 102 and 104 may be low conduction loss, low-voltage n-channel enhancement mode silicon MOSFETS, such as Infineon Technology's BSC050NE2LS, 5 mOhm on-resistance, 25V MOSFET.

The switch 106 is a dual-gate normally-on switch which may be fabricated, for example, using a wide bandgap semiconductor material such as an aluminum gallium nitride/gallium nitride (AlGaN/GaN) material system, silicon carbide (SiC), or similar materials having a larger bandgap and hence larger critical electric field than silicon. In one embodiment, the switch 106 is a dual-gate, low conduction loss, small area (for example at blocking voltage (BV)=1200V, RDSon*Area<5∴$10^{-3}$ Ohm $cm^2$), bidirectional, normally-on, high-voltage (blocking voltage greater than 800V) switch fabricated using a AlGaN/GaN based High Electron Mobility Transistor (HEMT) structure as described in detail below with respect to FIG. 2.

Figure 2:
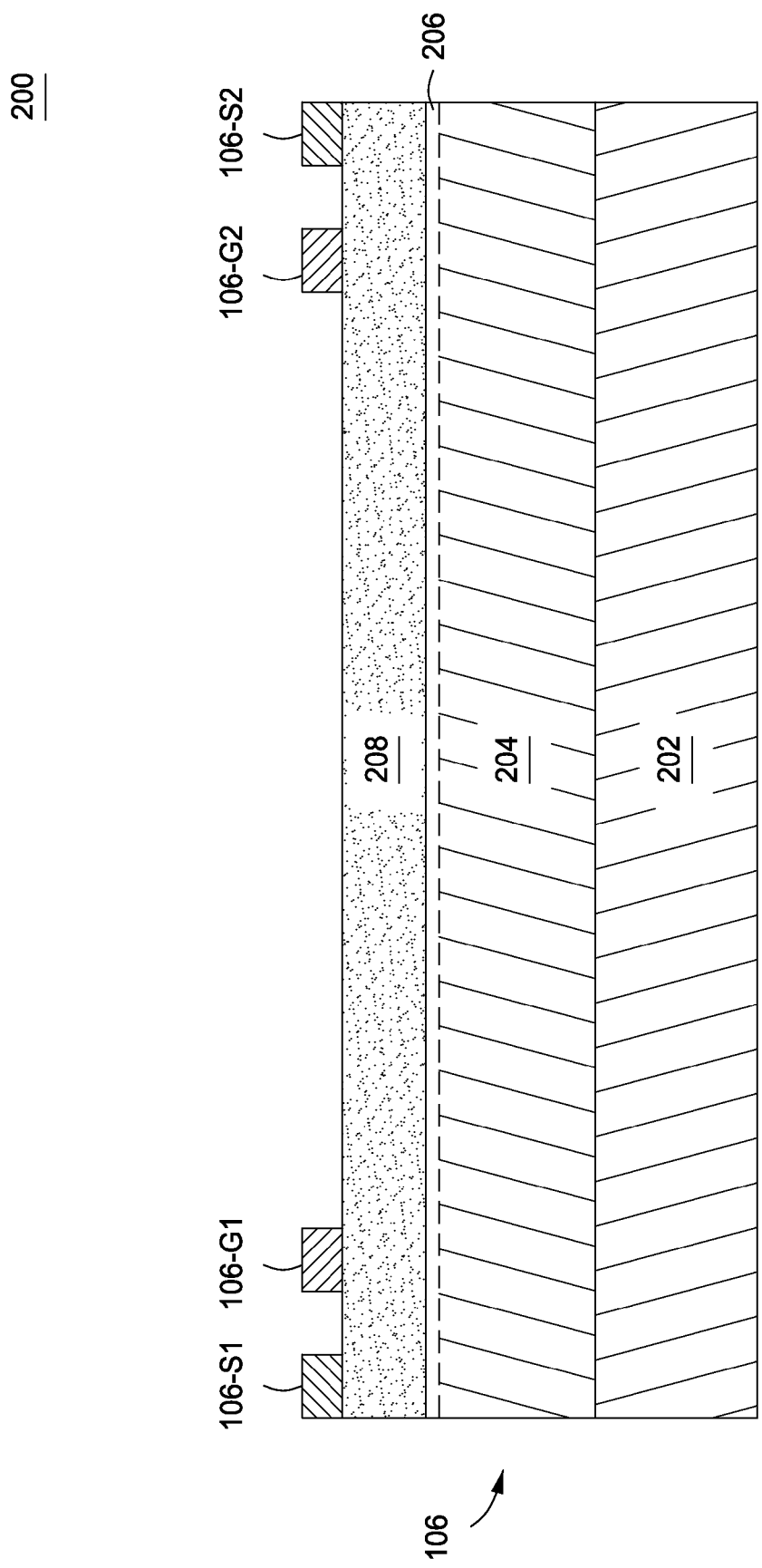
FIG. 2 is a cross-sectional view of a structure of a switch in accordance with one or more embodiments of the present invention.

FIG. 2 is a cross-sectional view of a structure of a switch 106 (having for example blocking voltage=1200V, on-resistance=0.1 Ohm and area=$3\times10^{-3}$ $cm^2$) in accordance with one or more embodiments of the present invention. The switch 106 comprises layers 202, 204, 206 and 208, with the source terminals 106-S1/106-S2 and gate terminals 106-G1/

106-G2 coupled to the layer 208. The source terminals are typically thin metal layers with composition known in the art to make ohmic contact to layer 208, and the gate terminals are typically thin metal layers with composition known in the art that produces a Schottky contact to layer 208. The layer 202 is a substrate, such as GaN, SiC, $Al_2O_3$ (Aluminum oxide), or silicon, generally with thickness of 200 microns or more. A buffer layer between layers 202 and 204 may optionally be present depending on the type of substrate that is used.

The layer 204 is a GaN layer sandwiched between the layer 202 and the layer 208, which is an AlGaN layer. Layer 208 will generally have a thickness of less than 1 micron and is commonly in the range of 0.02 to 0.2 microns. Also, layer 208 may have an aluminum composition, x, ranging from x=0.01 to 1 where the composition is designated as in $Al_xGa_{1-x}N$, The layer 206 is a two-dimensional electron gas (2DEG) layer formed between layers 204 and 208, i.e, a thin layer of highly mobile conducting electrons (electron mobility of 1100 $cm^2$/Vs or more) with very high concentration (electron sheet concentration of $10^{13}$ $cm^{-2}$ or more), giving the channel very low resistivity. A voltage applied to either of the gates 106-G1 or 106-G2 alters the conductivity of this layer. The thickness of layer 204 will generally be more than 2 microns and commonly 6 microns or more depending on the blocking voltage of the device. The thickness of this layer must be increased the higher the blocking voltage of the device. The separation distance between the gate terminals 106-G1 and 106-G2 also affects the blocking voltage capability of the device with increased separation distance needed for increased blocking voltage. For example the 106-G1 to 106-G2 separation distance will generally be more than 5 microns and commonly 15-30 microns for AlGaN/GaN based devices ranging from 800V to 1200V. The separation distance between the source and gate terminals at each end of the device (i.e., 106-S1 to 106-G1 and 106-S2 to 106-G2) can be much smaller, generally 0.5 to 2 microns, without effecting the blocking voltage of the device.

The gate terminals 106-G1 and 106-G2 are insulated and hence have very low leakage current, for example on the order of 100 nA/mm or less. The gate control characteristics may be manufactured with tight tolerance on the threshold voltage and can tolerate a range of control voltages, for example maximum gate voltage relative to source "VGS" of +2V and minimum "VGS" of −10V, without degradation.

The relatively small chip area of the switch 106, for example on the order of 20 times smaller than an analogous silicon-based device, enables the switch 106 to have lower parasitic capacitance (more than 10× lower compared to an analogous silicon-based device) and hence lower dynamic switching power loss, allows a higher operating frequency (more than 10× higher compared to an analogous silicon-based device), reduces cost of the chip and enables a smaller size circuit board.

Figure 3:
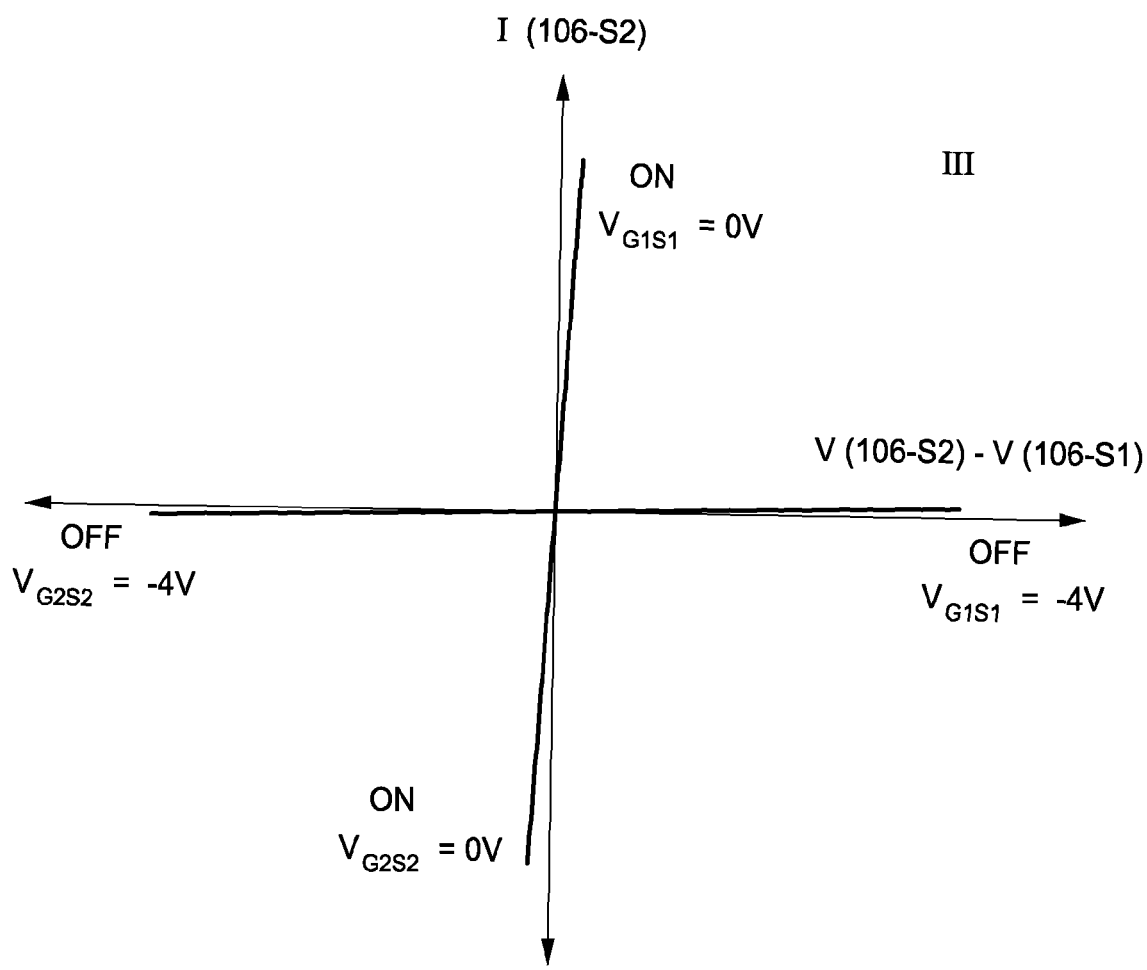
FIG. 3 is a four quadrant voltage-current plane graph depicting drain characteristics of the switch in accordance with one or more embodiments of the present invention.

FIG. 3 is a four quadrant voltage-current plane graph 300 depicting drain characteristics of the switch 106 in accordance with one or more embodiments of the present invention. The dual-gate normally-on switch 106 is controlled by the voltage present from gate to source as depicted in the graph 300, i.e., the voltage from gate 106-G1 to source 106-S1 (shown as VG1S1), and the voltage from gate 106-G2 to source 106-S2 (shown as VG2S2). The gate-to-source values depicted in the graph 300 are representative of one embodiment of the switch 106.

Figure 4:
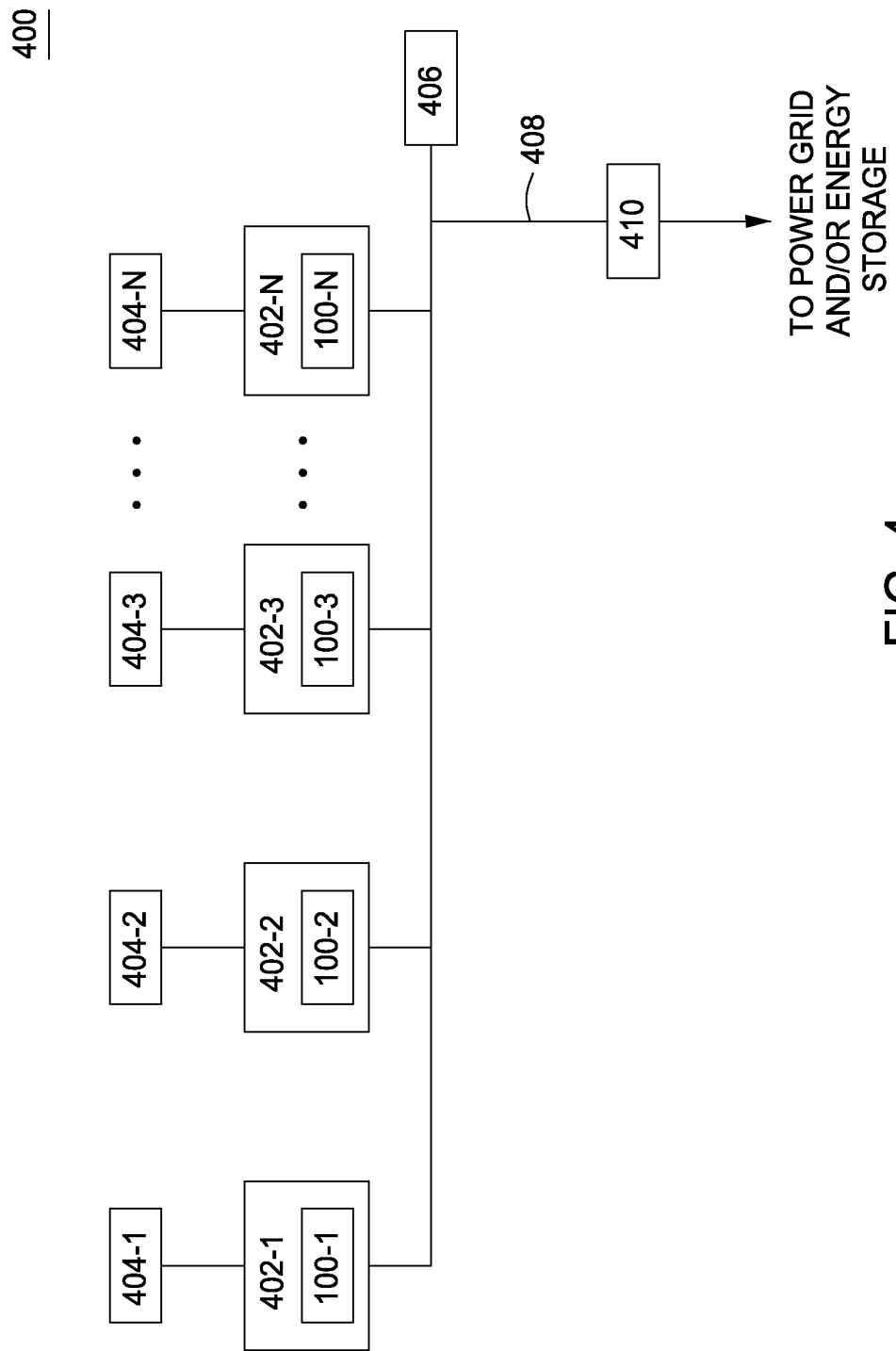
FIG. 4 is a block diagram of a system for power conversion comprising one or more embodiments of the present invention.

FIG. 4 is a block diagram of a system 400 for power conversion comprising one or more embodiments of the present invention. This diagram only portrays one variation of the myriad of possible system configurations and devices that may utilize the present invention. The present invention can be utilized in any system or device requiring a fully controlled, four quadrant, bidirectional switch.

The system 400 comprises a plurality of power converters 402-1, 402-2, 402-3 . . . 402-N, collectively referred to as power converters 402; a plurality of DC power sources 404-1, 404-2, 404-3 . . . 404-N, collectively referred to as DC power sources 404; a system controller 406; a bus 408; and a load center 410. The DC power sources 404 may be any suitable DC source, such as an output from a previous power conversion stage, a battery, a renewable energy source (e.g., a solar panel or photovoltaic (PV) module, a wind turbine, a hydroelectric system, or similar renewable energy source), or the like, for providing DC power.

Each power converter 402-1, 402-2, 402-3 . . . 402-N is coupled to a single DC power source 404-1, 404-2, 404-3 . . . 404-N, respectively; in some alternative embodiments, multiple DC power sources 404 may be coupled to a single power converter 402, for example a single centralized power converter 402. Each of the power converters 402 comprises at least one bidirectional power switch 100 (e.g., the power converters 402-1, 402-2, 402-3 . . . 402-N comprise the bidirectional power switches 100-1, 100-2, 100-3 . . . 100-N, respectively) utilized during power conversion. In some embodiments, the power converters 402 may be resonant power converters comprising cycloconverters that employ the bidirectional power switch 100.

The power converters 402 are coupled to the system controller 406 via the bus 408. The system controller 406 is capable of communicating with the power converters 402 by wireless and/or wired communication for providing operative control of the power converters 402. The power converters 402 are further coupled to the load center 410 via the bus 408.

The power converters 402 are each capable of converting the received DC power to AC power, although in other embodiments the power converters may receive an AC input and convert the received input to a DC output. The power converters 402 couple the generated output power to the load center 410 via the bus 408. The generated power may then be distributed for use, for example to one or more appliances, and/or the generated energy may be stored for later use, for example using batteries, heated water, hydro pumping, $H_2O$-to-hydrogen conversion, or the like. In some embodiments, the power converters 402 convert the DC input power to AC power that is commercial power grid compliant and couple the AC power to the commercial power grid via the load center 410.

In some alternative embodiments, the power converters 402 may be DC-DC power converters; in other alternative embodiments, the power converters 402 may receive an AC input and be AC-AC converters (e.g., AC-AC matrix converters).

Figure 5A:
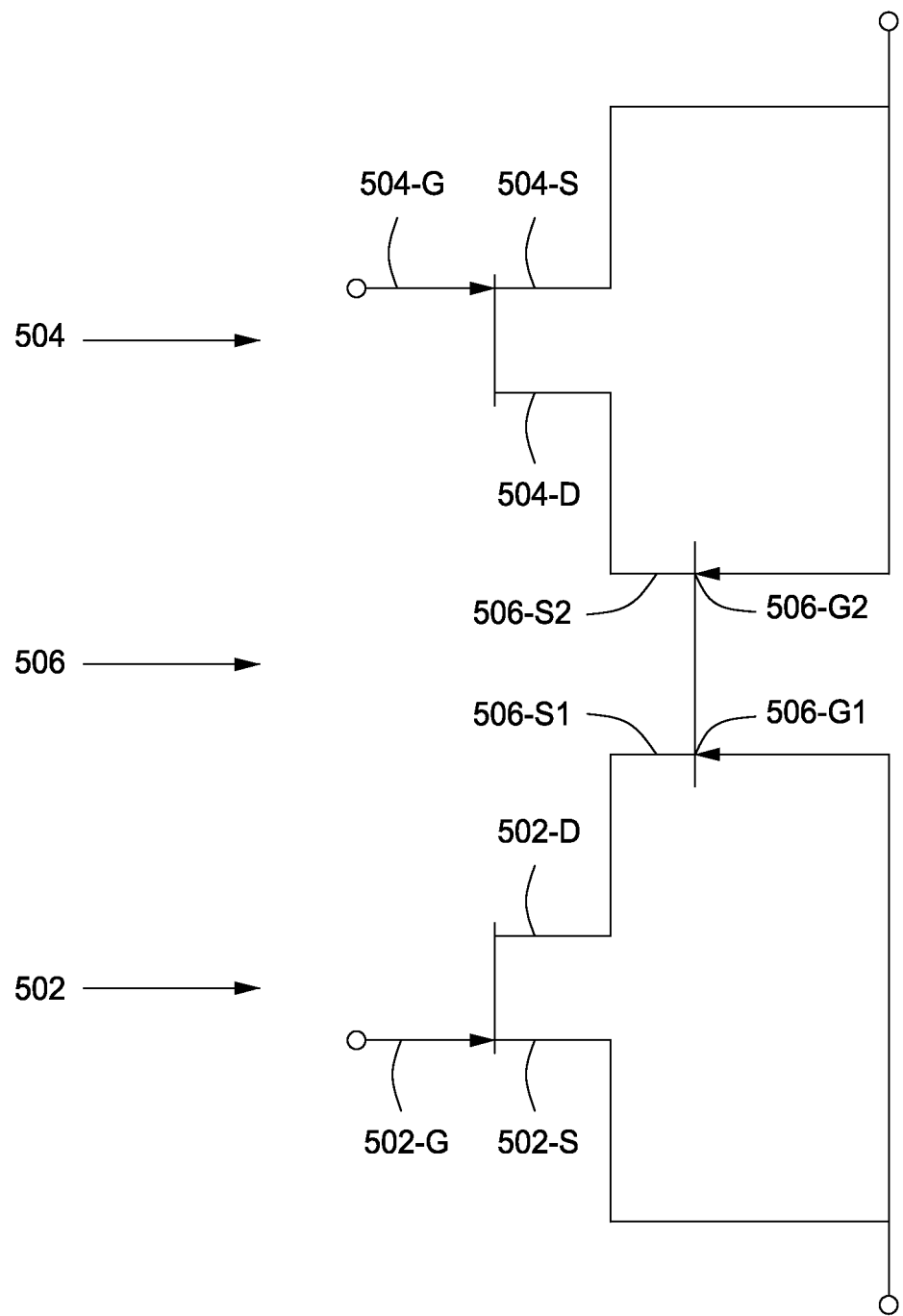
FIG. 5a is a schematic diagram of a bidirectional power switch in accordance with one or more alternative embodiments of the present invention

FIG. 5a is a schematic diagram of a bidirectional power switch 500 in accordance with one or more alternative embodiments of the present invention. The bidirectional power switch 500, also referred to as "switch 500", may be implemented on a single substrate as described further below with respect to FIG. 6. Analogous to the switch 100, the switch 500 is a fully controlled, four quadrant bidirectional power switch. The switch 500 comprises switches 502, 504, and 506. In one embodiment, the switches 502 and 504 are each normally-off gallium nitride (GaN) High Electron Mobility Transistors (HEMTs), and the switch 106 is a single high-voltage (blocking voltage >800V) dual-gate normally-on GaN HEMT, having low on-state resistance and small area, for example a 1200V rated device would have RDSon*Area<5×$10^{-3}$ Ohm $cm^2$. The switches 502, 506, and 504 are coupled in a bi-directional cascode, or bi-cascode, configuration, where a drain terminal 502-D of the switch 502 is coupled to a first source terminal 506-S1 of the switch 506, and a second source terminal 506-S2 of the switch 506 is coupled to a drain terminal 504-D of the switch 504. A source terminal 502-S of the switch 502 is coupled to a first gate terminal 506-G1 of the switch 506, and a second gate terminal 506-G2 of the switch 506 is coupled to a source terminal 504-S of the switch 504.

In FIG. 5a, the switches 502 and 504 are shown without anti-parallel diodes between the source and drain terminals of either switch 502 or 504. Proper operation in the on-state of this embodiment of the bidirectional switch 500 requires that both switches 502 and 504 be turned on when conducting a positive current or a negative current.

Figure 5B:
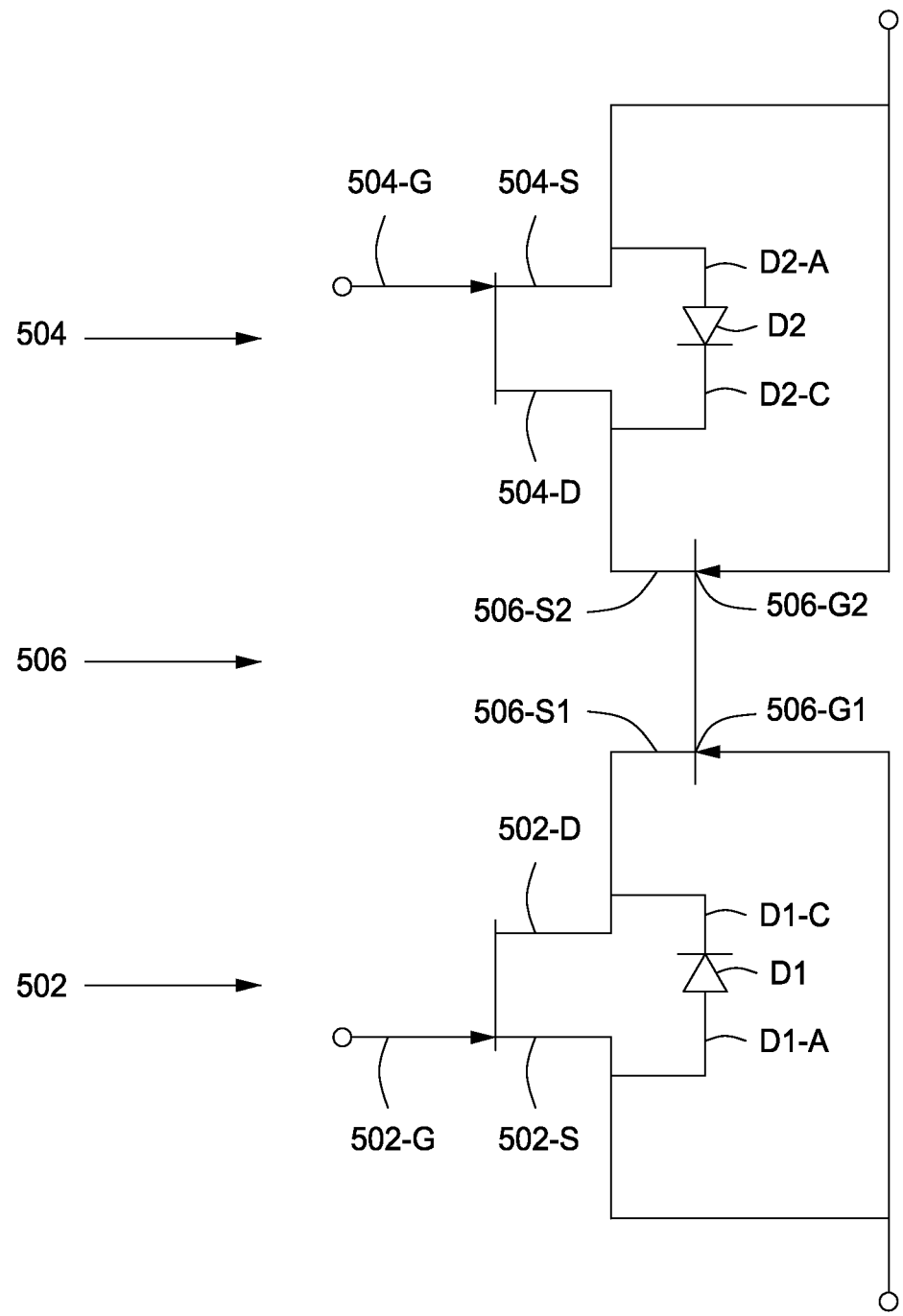
FIG. 5b is a schematic diagram of a bidirectional power switch in accordance with one or more alternative embodiments of the present invention.

FIG. 5b is a schematic diagram of a bidirectional power switch 500 in accordance with one or more alternative embodiments of the present invention. As depicted in FIG. 5b, diode D1 is present across the drain and source terminals 502-D and 502-S of switch 502, with cathode D1-C tied to drain terminal 502-D and anode D1-A tied to 502-S, and diode D2 is present across the drain and source terminals 504-D and 504-S of switch 504, with cathode D2-C tied to drain terminal 504-D and anode D2-A tied to source terminal 504-S. This embodiment no longer has the restriction that both switches 502 and 504 must be in their conducting state for proper operation in the on-state of the bi-directional switch 500. For example, if positive current enters through the top terminal (504-S), switch 504 may either be on or off while switch 502 must be on. In this case, if switch 504 is off then diode D2 will conduct and allow current to flow. Likewise, if positive current enters through the bottom terminal (502-S), switch 502 may either be on or off while switch 504 must be on. In this case, if switch 502 is off then diode D1 will conduct and allow current to flow.

Figure 6:
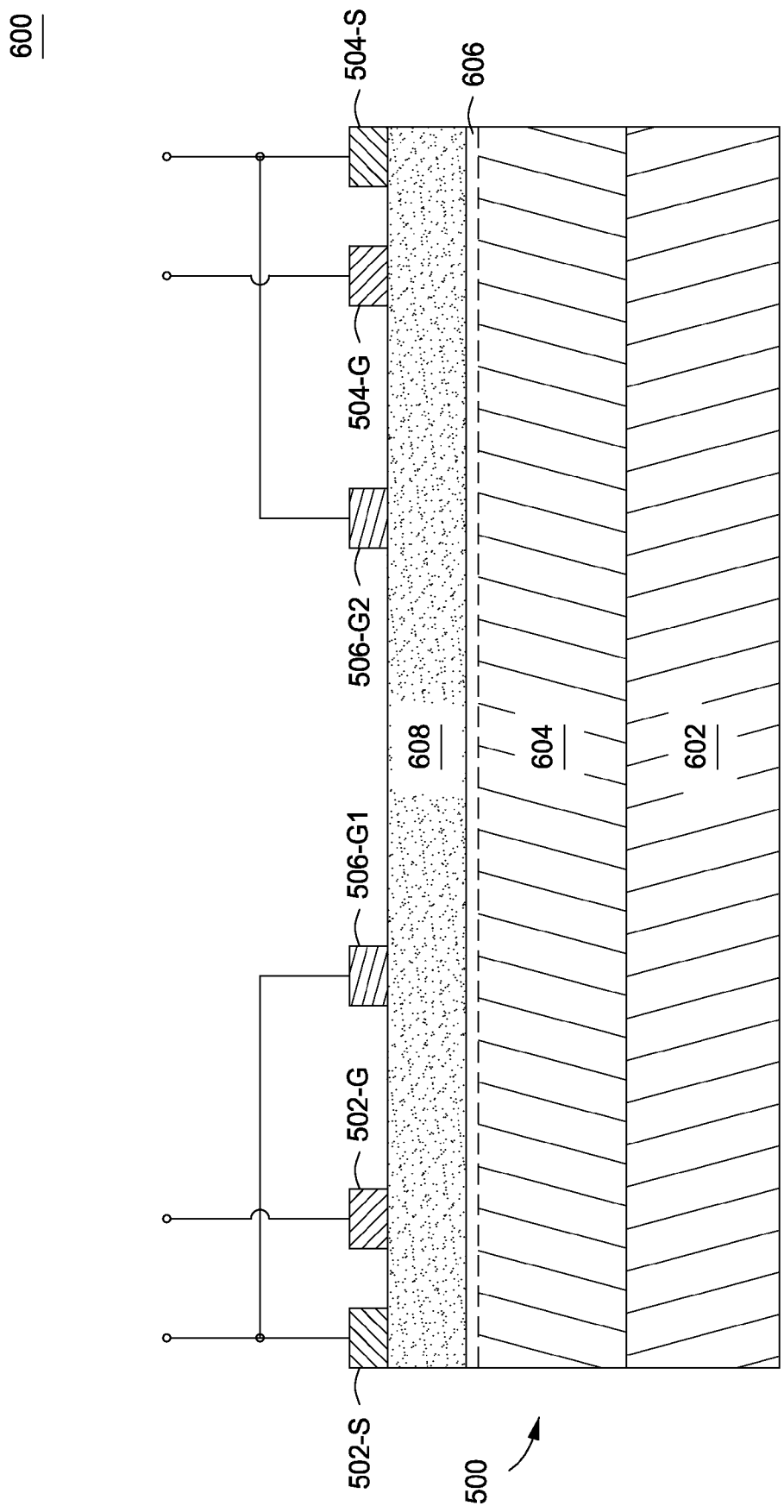
FIG. 6 is a cross-sectional view of a structure of a switch in accordance with one or more alternative embodiments of the present invention.

FIG. 6 is a cross-sectional view of a structure of a switch 500 in accordance with one or more alternative embodiments of the present invention. The switch 500 comprises layers 602, 604, 606 and 608. Source terminals 502-S and 504-S as well as the gate terminals 502-G, 504-G, 506-G1 and 506-G2 are coupled to the layer 608. The source terminals 502-S and 504-S are typically thin metal layers with composition known in the art to make ohmic contact to layer 608, The gate terminals 506-G1 and 506-G2 are typically thin metal layers with composition known in the art that produces a Schottky contact to layer 608 and gate terminals 502-G and 504-G are typically of material known in the art to make the adjacent (below) 2DEG region devoid of electrons (non-conducting) with zero bias voltage on the gate and conducting with positive bias voltage on the gate. The layer 602 is a substrate, such as GaN, SiC, $Al_2O_3$ (Aluminum oxide), or silicon, generally with thickness of 200 microns or more. A buffer layer between layers 602 and 604 may optionally be present depending on the type of substrate that is used.

The layer 604 is a GaN layer sandwiched between the layer 602 and the layer 608, which is an AlGaN layer. Layer 608 will generally have a thickness of less than 1 micron and is commonly in the range of 0.02 to 0.2 microns. Also, layer 608 may have an aluminum composition, x, ranging from x=0.01 to 1 where the composition is designated as in $Al_xGa_{1-x}N$. The layer 606 is a two-dimensional electron gas (2DEG) layer formed between layers 604 and 608, i.e., a thin layer of highly mobile conducting electrons (electron mobility of 1100 $cm^2$/Vs or more) with very high concentration (electron sheet concentration of $10^{13}$ $cm^{-2}$ or more), giving the channel very low resistivity. A voltage applied to any of the gates 502-G, 504-G, 506-G1 or 506-G2 alters the conductivity of this layer.

The thickness of layer 604 will generally be more than 2 microns and commonly 6 microns or more depending on the blocking voltage of the device. The thickness of this layer must be increased the higher the blocking voltage of the device. The separation distance between the gate terminals 506-G1 and 506-G2 also affects the blocking voltage capability of the device with increased separation distance needed for increased blocking voltage. For example the 106-G1 to 106-G2 separation distance will generally be more than 5 microns and commonly 15-30 microns for AlGaN/GaN based devices ranging from 800V to 1200V. The separation distance between the source and gate terminals at each end of the device (i.e., 502-S to 502-G, 502-G to 506-G1, 504-S to 504-G, and 504-G to 506-G2) can be much smaller, generally 0.5 to 2 microns, without effecting the blocking voltage of the device.

The foregoing description of embodiments of the invention comprises a number of elements, devices, circuits and/or assemblies that perform various functions as described. These elements, devices, circuits, and/or assemblies are exemplary implementations of means for performing their respectively described functions.

While the foregoing is directed to embodiments of the present invention, other and further embodiments of the invention may be devised without departing from the basic scope thereof, and the scope thereof is determined by the claims that follow.

The invention claimed is:

1. A four quadrant bidirectional switch comprising:
a bidirectional power switch having a first switch, a second switch, and a third switch, wherein (i) the first and second switches are normally-off switches, (ii) the third switch is a dual-gate, bidirectional, normally-on switch, and (iii) the first, the second, and the third switches are coupled to one another in a bi-cascode configuration; and wherein the bidirectional power switch operates in each quadrant of a four quadrant voltage-current plane.

2. The four quadrant bidirectional switch of claim 1, wherein the first and second switches are silicon metal-oxide-semiconductor field-effect transistors (MOSFETS).

3. The four quadrant bidirectional switch of claim 2, wherein the first and second switches are n-channel enhancement mode switches.

4. The four quadrant bidirectional switch of claim 1, wherein the third switch comprises a wide bandgap semiconductor material.

5. The four quadrant bidirectional switch of claim 4, wherein the wide bandgap semiconductor material is aluminum gallium nitride/gallium nitride (AlGaN/GaN).

6. The four quadrant bidirectional switch of claim 5, wherein the third switch employs a High Electron Mobility Transistor (HEMT) structure.

7. The four quadrant bidirectional switch of claim 1, wherein the bidirectional power switch is implemented on a single substrate.

8. A power conversion system, comprising:
a power converter comprising a bidirectional power switch comprising a first switch, a second switch, and a third switch, wherein (i) the first and second switches are normally-off switches, (ii) the third switch is a dual-gate, bidirectional, normally-on switch, and (iii) the first, the second, and the third switches are coupled to one another in a bi-cascode configuration; and wherein the bidirectional power switch operates in each quadrant of a four quadrant voltage-current plane.

9. The power conversion system of claim 8, wherein the first and second switches are silicon metal-oxide-semiconductor field-effect transistors (MOSFETS).

10. The power conversion system of claim 9, wherein the first and second switches are n-channel enhancement mode switches.

11. The power conversion system of claim 8, wherein the third switch comprises a wide bandgap semiconductor material.

12. The power conversion system of claim 11, wherein the wide bandgap semiconductor material is aluminum gallium nitride/gallium nitride (AlGaN/GaN).

13. The power conversion system of claim 12, wherein the third switch employs a High Electron Mobility Transistor (HEMT) structure.

14. The power conversion system of claim 8, wherein the bidirectional power switch is implemented on a single substrate.

15. The power conversion system of claim 8, wherein the power converter is a resonant converter.

16. The power conversion system of claim 8, wherein the power converter is a DC-DC converter.

17. The power conversion system of claim 8, wherein the power converter is a DC-AC inverter.

18. The power conversion system of claim 8, wherein the power converter is an AC-AC converter.

19. The power conversion system of claim 8, wherein the power converter receives a DC input from a renewable energy source.

20. The power conversion system of claim 19, wherein the renewable energy source is a photovoltaic (PV) module.

\* \* \* \* \*